US006621729B1

(12) United States Patent
Garni et al.

(10) Patent No.: US 6,621,729 B1
(45) Date of Patent: Sep. 16, 2003

(54) SENSE AMPLIFIER INCORPORATING A SYMMETRIC MIDPOINT REFERENCE

(75) Inventors: Bradley J. Garni, Austin, TX (US); Chitra K. Subramanian, Austin, TX (US); Joseph J. Nahas, Austin, TX (US); Thomas W. Andre, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/185,224

(22) Filed: Jun. 28, 2002

(51) Int. Cl.[7] .............................................. G11C 11/00
(52) U.S. Cl. ........................ 365/158; 365/207; 365/210
(58) Field of Search ............................ 365/189.07, 158, 365/207, 210

(56) References Cited

U.S. PATENT DOCUMENTS

| | | |
|---|---|---|
| 4,713,797 A | 12/1987 | Morton et al. |
| 5,694,367 A * | 12/1997 | Toyoshima et al. ......... 365/207 |
| 6,236,611 B1 | 5/2001 | Naji |
| 6,269,040 B1 | 7/2001 | Reohr et al. |
| 6,385,109 B1 | 5/2002 | Naji |
| 6,392,923 B1 | 5/2002 | Naji |
| 6,504,752 B2 * | 1/2003 | Ito .............................. 365/158 |

* cited by examiner

Primary Examiner—Huan Hoang
(74) Attorney, Agent, or Firm—Robert L. King; James L. Clingan, Jr.

(57) ABSTRACT

A sense amplifier (10) develops internally a midpoint reference current from two reference bits. The midpoint reference current is used to sense the state of a memory bit having at least two distinct resistance states (H and L) by determining whether the sense memory bit develops a larger or smaller current. The midpoint reference current is developed within a single sense amplifier. Predetermined bias voltages are developed from each of a data bit cell, a reference cell programmed to a high state and a reference cell programmed to a low state. Currents are developed from the bias voltages and summed to create the midpoint reference current. A current differential amplifier senses whether the bit input has a high or low resistive state and outputs a voltage indicative of the sensed memory state.

20 Claims, 2 Drawing Sheets

SENSE AMPLIFIER INCORPORATING A SYMMETRIC MIDPOINT REFERENCE

FIELD OF THE INVENTION

This invention relates to Magnetoresistive Random Access Memories (MRAMs) and other memories where the memory bit has at least two distinct resistance states, and more particularly to sense amplifier circuits for such memories.

BACKGROUND OF THE INVENTION

Non-volatile memory devices, such as FLASH memories, are extremely important components in electronic systems. FLASH is a major non-volatile memory device in use today. Disadvantages of FLASH memory include high voltage requirements and slow program and erase times. Also, FLASH memory has a poor write endurance of $10^4$–$10^6$ cycles before memory failure. In addition, to maintain reasonable data retention, the scaling of the gate oxide is restricted by the tunneling barrier seen by the electrons. Hence, FLASH memory is limited in the dimensions to which it can be scaled.

To overcome these shortcomings, other types of nonvolatile memories are being evaluated. One such device is magnetoresistive RAM (hereinafter referred to as "MRAM"). To be commercially practical, however, MRAM must have comparable memory density to current memory technologies, be scalable for future generations, operate at low voltages, have low power consumption, and have competitive read/write speeds.

MRAM bit cells store data by varying the resistance of a magnetic tunnel junction (MTJ) between low (R) and high (R+dR) states. For most memories, the state of the memory cell is determined by comparing the memory cell to a reference, often a midpoint value. Accordingly, for MRAM, the reference is developed as a midpoint reference, an average of high and low states, to provide a mechanism to determine the stored value in a cell. In U.S. Pat. No. 6,236,611 entitled "Peak Program Current Reduction Apparatus and Method" by Naji a solution is offered wherein a combination of four reference bits, two high and two low, provide a midpoint reference. However, MTJ resistances are not linear. The series and parallel combination used by Naji does not produce a true midpoint reference. There is an asymmetry between the difference from the high value to the reference and the difference from the reference to the low value. Additionally, symmetry in bit line capacitance is desired and is more problematic with references using multiple resistances. In U.S. Pat. No. 6,269,040 by Reohr et al. entitled "Interconnection Network For Connecting Memory Cells to Sense Amplifiers", a memory circuit is disclosed in which a midpoint reference is obtained by averaging memory reference cells, one high and one low. The midpoint reference shares signals between references from adjacent arrays via an interconnect network that is almost but not fully balanced. In the Reohr et al. memory, two sense amplifiers are required to perform the averaging. Thus, a need remains for a sensing circuit using a midpoint reference that requires a minimum of area, provides a true nearby midpoint reference, and maintains symmetry in the circuit path for balanced loading including parasitic capacitances and resistances.

BRIEF DESCRIPTION OF THE DRAWINGS

The foregoing and further and more specific objects and advantages of the instant invention will become readily apparent to those skilled in the art from the following detailed description of the invention taken in conjunction with the following drawings.

Skilled artisans appreciate that elements in the figures are illustrated for simplicity and clarity and have not necessarily been drawn to scale.

DETAILED DESCRIPTION OF THE INVENTION

Figure 1:
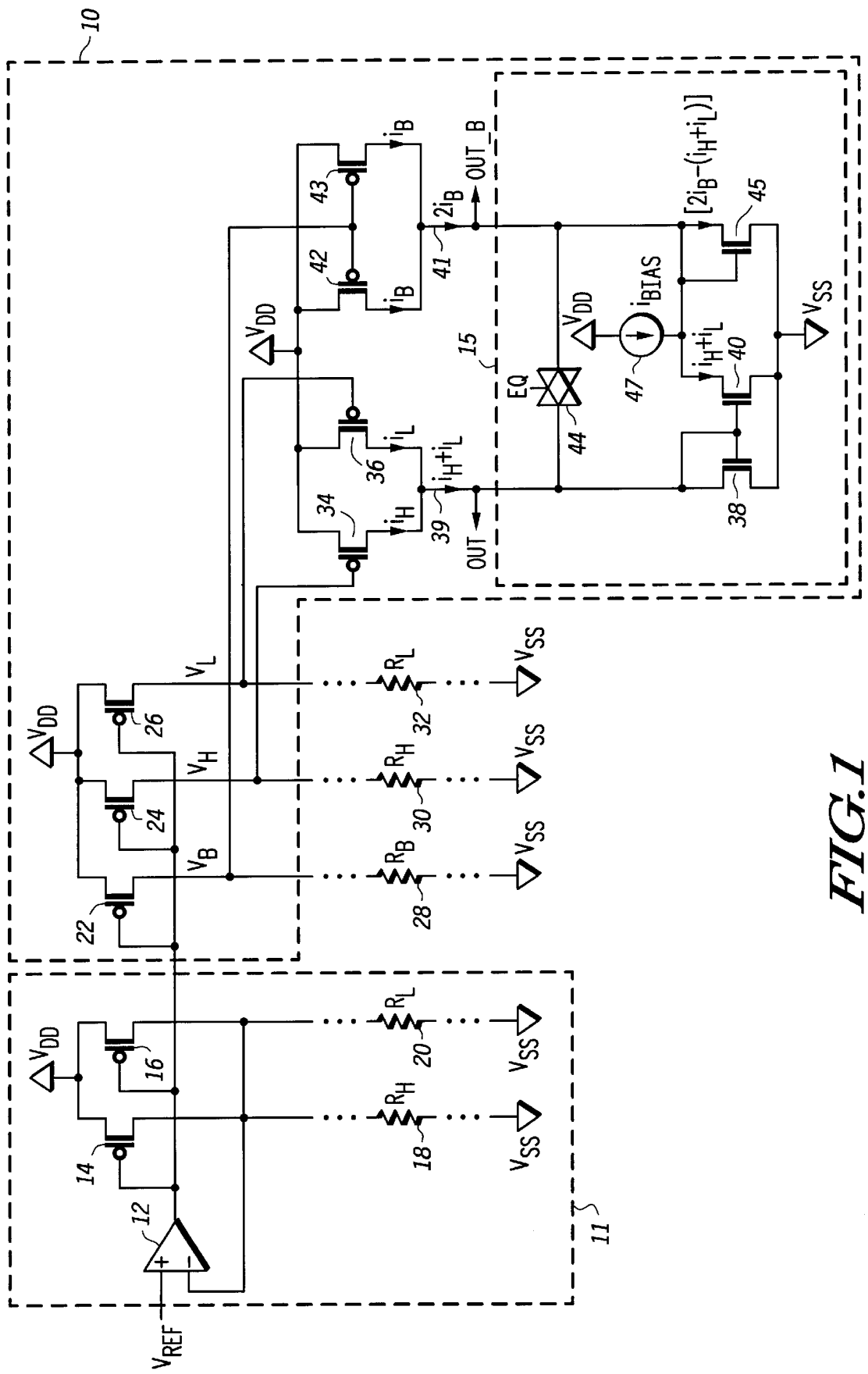
FIG. 1 is a schematic diagram of a sense amplifier in accordance with the present invention.

FIG. 1 illustrates a memory sense amplifier 10, a voltage bias circuit 11, and resistances $R_B$, $R_H$, $R_L$ associated with a memory array. An operational amplifier 12 has a positive or a first input connected to a reference voltage, Vref, a negative or a second input, and an output connected to a control electrode or a gate of a P-channel transistor 14. The output of operational amplifier 12 provides the bias voltage of voltage bias circuit 11. A first current electrode or source of transistor 14 is connected to a first power supply terminal or supply voltage terminal for receiving a voltage $V_{DD}$. A second current electrode or drain of transistor 14 is coupled to the negative or second input of the operational amplifier 12 and coupled via one or more coupling devices (not shown) to a first terminal of a first reference high bit in the form of a resistance 18 that is a memory cell programmed to a high resistive state. Resistance 18 is therefore represented as having a resistance of value $R_H$. A second terminal of resistance 18 is coupled via one or more coupling devices (not shown) to a supply voltage terminal for receiving a voltage $V_{SS}$. A P-channel transistor 16 has a source connected to the $V_{DD}$ supply voltage terminal, a gate connected to the output of operational amplifier 12, and a drain is coupled to the negative or second input of the operational amplifier 12 and coupled via one or more coupling devices (not shown) to a first terminal of a first reference low bit or a resistance 20 that is a memory cell programmed to a low resistive state. Resistance 20 is therefore represented as having a resistance of value $R_L$. A second terminal of resistance 20 is coupled via one or more coupling devices (not shown) to the $V_{SS}$ supply voltage terminal.

Sense amplifier 10 functions to sense the memory state of the cell having a resistive value represented by $R_B$. Within sense amplifier 10, the output of operational amplifier 12 is connected to a gate of a P-channel transistor 22, to a gate of a P-channel transistor 24 and to a gate of a P-channel transistor 26. A source of each of transistors 22, 24 and 26 is connected to the $V_{DD}$ supply voltage terminal. A drain of transistor 22 is connected to a gate of a P-channel transistor 42 for providing a bias voltage, $V_B$. The drain of transistor 22 is coupled via one or more coupling devices (not shown) to a memory bit cell in the memory array of unknown memory state having a first terminal of a resistance 28 of value $R_B$. A second terminal of the memory bit cell 28 is coupled via one or more coupling devices (not shown) to the $V_{SS}$ supply voltage terminal. The drain of transistor 24 is coupled via one or more coupling devices (not shown) to a first terminal of a first reference memory cell 30 in the memory array that is in the high resistance state having the value $R_H$. A second terminal of a first reference memory cell 30 is coupled via one or more coupling devices (not shown) to the $V_{SS}$ supply voltage terminal. The drain of transistor 26 is coupled via one or more coupling devices (not shown) to a second reference memory cell 32 in the memory array that is in the low resistive state with the value $R_L$. A second terminal of the second reference memory cell 32 is coupled via one or more coupling devices (not shown) to the $V_{SS}$ supply voltage terminal. A P-channel transistor 34 has a source connected to the $V_{DD}$ power supply terminal, a gate connected to the drain of transistor 24, and a drain connected to a gate of an N-channel transistor 38 at a node 39. A P-channel transistor 36 has a source connected to the $V_{DD}$ power supply terminal, a gate connected to the drain of transistor 26, and a drain connected to the gate of transistor 38 at node 39 that functions as an output of sense amplifier 10. Transistor 34 conducts a current $i_H$ and transistor 36 conducts a current $i_L$. Transistor 38 has a drain connected to its gate thereof at node 39, and a source connected to the $V_{SS}$ power supply terminal. An N-channel transistor 40 has a gate connected to node 39, a source connected to the $V_{SS}$ power supply terminal, and a drain. A P-channel transistor 42 has a source connected to the $V_{DD}$ power supply terminal, a gate connected to the drain of transistor 22 for receiving the $V_B$ bias voltage, and a drain connected to the drain of transistor 40 at a node 41 that functions as an output of sense amplifier 10. Transistor 42 conducts a current equal to $i_B$. A P-channel transistor 43 has a source connected to the $V_{DD}$ power supply terminal, a gate connected to the drain of transistor 22 for receiving the $V_B$ bias voltage, and a drain connected to the drain of transistor 40 at node 41. Transistor 43 also conducts a current equal to $i_B$. An equalization switch 44 has a first terminal connected to node 39 and a second terminal connected to node 41. A control terminal of switch 44 is connected to an Equalization control signal, labeled EQ. A drain of an N-channel transistor 45 is connected to node 41 and to a gate thereof. A source of transistor 45 is connected to the $V_{SS}$ power supply terminal. A first terminal of a current source 47 for providing a current, iBias, is connected to the VDD power supply terminal. A second terminal of current source 47 is connected to the gate and drain of transistor 45. It should be well understood that current source 47 is optional. If current source 47 is not present, the current conducted by transistor 45 is $[2i_B-(i_H+i_L)]$. Sense amplifier 10 is a three-input sense amplifier wherein the three inputs are formed by the gate of transistor 34, the gate of transistor 36 and the common gates of transistors 42 and 43.

In operation, sense amplifier 10 is a three-input sense amplifier that detects a state of memory cell 28 by using current sources, summing and current doubling circuits in conjunction with a current differential amplifier. The three inputs are represented by $V_H$, $V_L$ and $V_B$. The memory cell provides a memory cell current representing a resistance value, $R_B$, of the memory cell. Voltage bias circuit 11 functions to provide a bias voltage to transistors 22, 24 and 26 that provide a constant current source to each of resistances $R_B$, $R_H$ and $R_L$ from which voltages $V_B$, $V_H$ and $V_L$ are respectively developed. In other words, transistor 22 is a first constant current source, transistor 24 is a second constant current source and transistor 26 is a third constant current source. The bias voltage $V_B$ drives P-channel current source transistors 42 and 43, and $V_H$ and $V_L$ respectively drive P-channel current source transistors 34 and 36 in sense amplifier 10.

Transistors 34 and 36 form a summing circuit having a first input coupled to $V_H$, a second input coupled to $V_L$ and an output formed by node 39.

Transistors 34 and 36 generate $i_H$ and $i_L$, respectively, that are reference currents corresponding to the reference bits $R_H$ and $R_L$. Therefore, transistor 34 is a first voltage to current converter and transistor 36 is a second voltage to current converter. Those currents are summed onto node 39 that functions as a summing node. Transistor 38 functions to mirror the summed reference current to transistor 40. That current is equal to $(i_H+i_L)$. Transistors 42 and 43 each function as a voltage to current converter and develop the bit current $i_B$ that is summed together at the output node 41 to form a current $2i_B$.

Therefore, transistors 42 and 43 function as a current doubler. The current doubler is coupled between the output of the first constant current source, transistor 22, and the second input (node 41) of the current differential amplifier formed by transistors 38, 40 and 45. When the currents merge into output node 41, a difference current is conducted by transistor 45. The difference current is equal to $[2i_B-(i_H+i_L)]$. If $2i_B$ is greater than $(i_H+i_L)$, then the difference current will cause the capacitances at node 41 to charge so that the voltage at node 41 will be greater than the voltage at node 39.

Similarly, if $2i_B$ is less than $(i_H+i_L)$, then the difference current will cause the capacitances at node 41 to discharge so that the voltage at node 41 will be less than the voltage at node 39. Transistors 38, 40 and 45 in combination with current source 47 function as a current differential amplifier 15. It should be well understood that other circuit implementations may be used to implement a current differential amplifier. In the illustrated form, the physical sizing of transistors 38, 40 and 45, as accomplished by the transistor gate width and length dimensions, is important to the operation of the current differential amplifier in the proper region of current/voltage relationships of the low bit and high bit references. In particular, transistor 45 is sized significantly smaller than either transistor 38 or transistor 40 to function as a weak load device. Transistors 38 and 40 are matched to be substantially the same size and have the same current drive strength. A midpoint reference is obtained by summing the high and low reference currents. The midpoint reference current is compared with twice the bit current, $2i_B$, by the current differential amplifier.

An effective midpoint is created by summing currents $(i_H+i_L)$ at node 39. The midpoint is the average of the two currents. It represents the midpoint of the currents developed from the high and the low bit reference cells.

Voltage bias circuit 11 biases the current sources 22, 24 and 26 to obtain desired values for voltages $V_B$, $V_H$ and $V_L$. The desired values, by way of example only, may be approximately 300 mV relative to $V_{SS}$. Other voltages may be developed and used. It should be well understood that the desired values for these voltages is low enough to not damage the resistive memory cells, but high enough to obtain a significant differential between the voltages in order to obtain a suitable current differential in sense amplifier 10.

Symmetry of the reference voltages, $V_H$ and $V_L$, that are compared with the bit voltage, $V_B$, is desired. The voltages $V_H$, $V_L$ and $V_B$ are converted to currents. In order to optimize a differential between the reference currents and either bit state that the bit current may assume, the optimal reference current value approximates an average of the reference currents, $i_H$ and $i_L$. The conversion to current introduces a square term as $I(V_G-V_{THP})^2$. However, because the magnitude of the gate voltages, $V_H$, $V_L$ and $V_B$, substantially exceeds the difference between these voltages, the reference current approximates a midpoint reasonably well.

Prior to a sensing operation, the EQ equalization signal is asserted for a predetermined equalization time period to make switch 44 conductive. Nodes 39 and 41 are equalized in potential prior to the current summing and sensing operation to improve the read speed.

Figure 2:
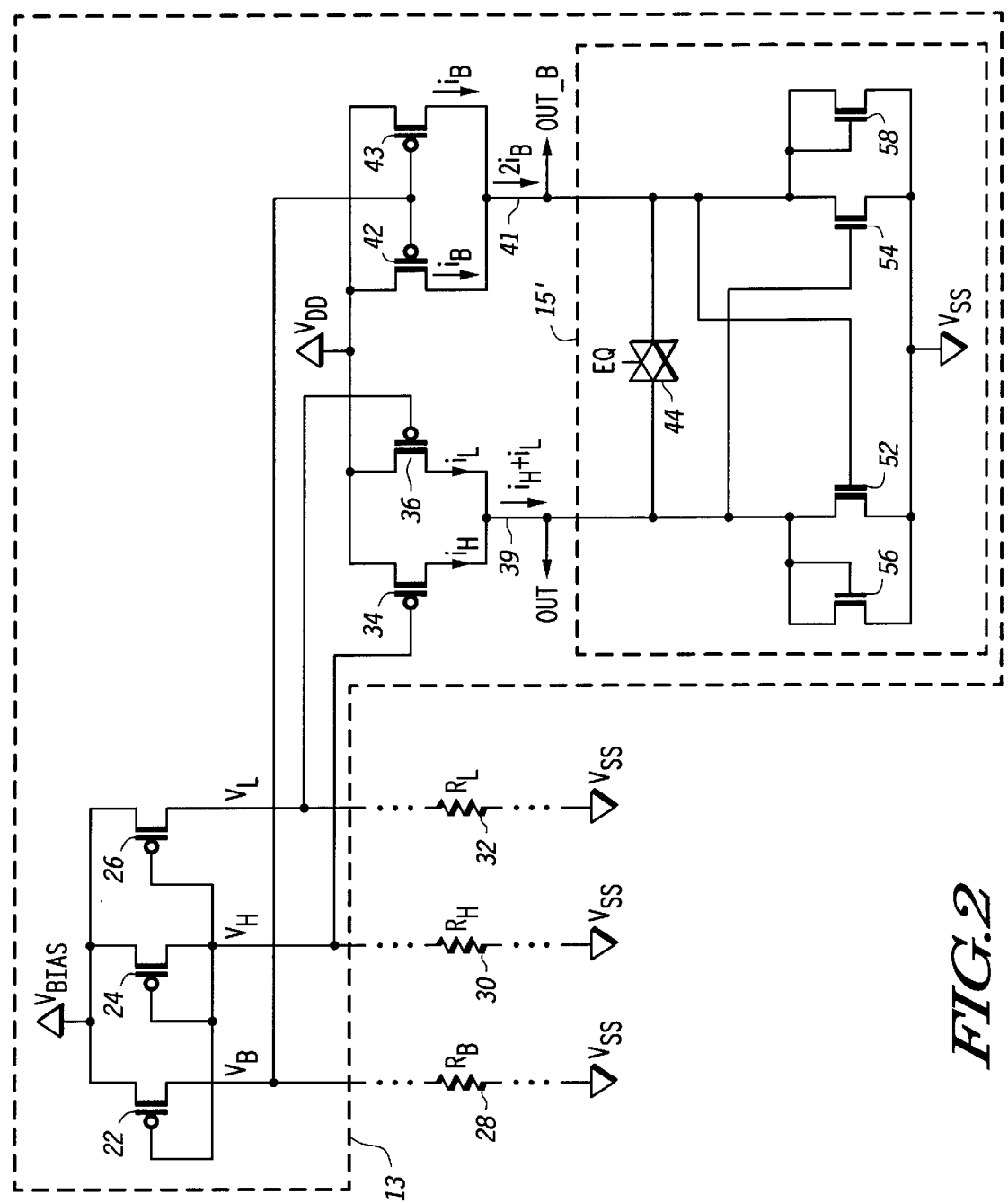
FIG. 2 is schematic diagram of another form of the sense amplifier in accordance with the present invention.

In an alternative form, a sense amplifier 13 illustrated in FIG. 2 illustrates two alternatives to the circuitry of sense amplifier 10 of FIG. 1. Firstly, sense amplifier 13 functions without using voltage bias 11 of FIG. 1. In the alternative form of FIG. 2, similar elements in common with sense amplifier 10 are numbered the same for ease of comparison. In sense amplifier 13, each of P-channel transistors 22, 24 and 26 has its gate connected to the drain of transistor 24. It should be well understood that the implementation of transistors 22 and 26 would include additional dummy (i.e. not functionally used) gates to make the loading on the drains of each of transistors 22, 24 and 26 to be substantially the same. In addition, the sources of transistors 22, 24 and 26 may be connected to a $V_{BIAS}$ voltage that is regulated (bias circuit not shown) to provide optimal operating points. In yet another alternative (not shown), the gates of each of transistors 22, 24 and 26 are respectively connected to their drains. In the later form, the transistors 22, 24 and 26 function as current mirror devices with respect to transistors 42 and 43, 34 and 36, respectively.

Secondly, sense amplifier 13 uses a different current differential amplifier than sense amplifier 10. An N-channel transistor 52 has a drain connected to node 39, a gate connected to node 41, and a source connected to the VSS supply voltage terminal. An N-channel transistor 54 has a drain connected to node 41, a gate connected to node 39, and a source connected to the VSS supply voltage terminal. An N-channel transistor 56 has a drain connected to a gate thereof and to node 39. Transistor 56 also has a source connected to the VSS supply voltage terminal. An N-channel transistor 58 has a drain connected to a gate thereof and to node 41. Transistor 58 also has a source connected to the VSS supply voltage terminal.

Transistors 52 and 54 function as a cross-coupled pair of transistors to differentiate which of two currents, 2iB and (iH+iL) has a greater magnitude. Depending upon which current has the greater magnitude will determine which logic value voltage will be present on the true and complement output terminals. The current differential amplifier implementation in FIG. 2 may be more balanced and hence parasitics may tend to be cancelled more favorably than in FIG. 1.

By now it should be apparent that there has been provided a three input sense amplifier for use in a memory such as an MRAM. By generating an effective midpoint reference to be used by the sense amplifier, the use of an externally supplied midpoint reference is avoided. External midpoint references are difficult to control and such references consume additional area on an integrated circuit than the circuitry used within the sense amplifier that permits the sense amplifier to generate an accurate midpoint reference. It is additionally preferable that sense amplifier 10 employs symmetry to minimize noise and optimize memory sense amplifier speed.

Various changes and modifications to the embodiments herein chosen for purposes of illustration will readily occur to those skilled in the art. For example, each of transistors 42 and 43 may be implemented as a single P-channel transistor having its physical dimensions sized to be twice the size of transistor 42 or transistor 43 in order to source a current of $2i_B$. The sense amplifier and gain stage improvements disclosed herein are applicable to other memory types whose state is manifested as a change in the resistance value of the bit. Variations in the types of conductivities of transistors, the types of transistors (e.g. MOS, GaAs, bipolar, etc.), the sizing of the transistors, etc. may be readily made. Although specific logic circuits have been shown, numerous logic circuit implementations may be used to implement the functions discussed herein. To the extent that such modifications and variations do not depart from the spirit of the invention, they are intended to be included within the scope thereof that is assessed only by a fair interpretation of the following claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A sense amplifier for detecting a state of a memory cell, comprising:
    a first constant current source having an input, and an output coupled to a memory cell;
    a second constant current source having an input, and an output coupled to a first reference high bit;
    a third constant current source having an input, and an output coupled to a first reference low bit;
    a reference voltage generator coupled to a second reference high bit and a second reference low bit and having an output coupled to the input of each of the first constant current source, the second constant current source, and the third constant current source;
    a summing circuit having a first input coupled to the output of the second constant current source, a second input coupled to the output of the third constant current source, and an output; and
    a current differential amplifier having a first input coupled to the output of the summing circuit, a second input coupled to the output of the first constant current source, the current differential amplifier providing an output signal representative of the state of the memory cell.

2. The sense amplifier of claim 1, further comprising a current doubler coupled between the second input of the current differential amplifier and the output of the first constant current source.

3. The sense amplifier of claim 2, wherein the first constant current source comprises a first transistor having a first current electrode coupled to a first power supply terminal, a control electrode coupled to the output of the reference voltage generator, and a second current electrode coupled to the memory cell and the current doubler.

4. The sense amplifier of claim 3, wherein the summing circuit comprises:
    a second transistor having a first current electrode coupled to the first power supply terminal, a control electrode coupled to the output of the second constant current source, and a second current electrode coupled to the first input of the current differential amplifier; and a third transistor having a first current electrode coupled to the first power supply terminal, a control electrode coupled to the output of the third constant current source, and a second current electrode coupled to the first input of the current differential amplifier.

5. A sense amplifier for detecting a state of a memory cell, comprising:

a first constant current source coupled to the memory cell and having an output;

a second constant current source coupled to a first reference high bit and having an output;

a third constant current source coupled to a first reference low bit and having an output;

a summing circuit having a first input coupled to the output of the second constant current source, a second input coupled to the output of the third constant current source, and an output; and a current differential amplifier having a first input coupled to the output of the summing circuit, a second input coupled to the output of the first constant current source, and an output for providing an output signal representative of the state of the memory cell.

6. The sense amplifier of claim 5, further comprising a current doubler coupled between the second input of the current differential amplifier and the output of the first constant current source.

7. The sense amplifier of claim 6, wherein the first constant current source comprises a first transistor having a first current electrode coupled to a first power supply terminal and a control electrode and a second current electrode coupled to the memory cell and the current doubler.

8. The sense amplifier of claim 7, wherein summing circuit comprises:

a second transistor having a first current electrode coupled to the first power supply terminal, a control electrode coupled to the output of the second constant current source, and a second current electrode coupled to the first input of the current differential amplifier; and a third transistor having a first current electrode coupled to the first power supply terminal, a control electrode coupled to the output of the third constant current source, and a second current electrode coupled to the first input of the current differential amplifier.

9. A sense amplifier for detecting a state of a memory cell, comprising:

memory cell means, coupled to the memory cell, for providing a memory cell current representing a resistance value of the memory cell;

doubler means for adding a doubling current substantially equal to the memory cell current to the memory cell current to form a doubled memory cell current;

reference means, coupled to a first reference high bit and a first reference low bit, for providing a reference high current representing a resistance value of the first reference high bit and providing a reference low current representing a resistance value of the first reference low bit;

summing means for summing the reference high current and the reference low current to provide a summed reference current; and a current differential amplifier having a first input for receiving the doubled memory cell current, a second input for receiving the summed reference current, and an output for providing an output signal representative of the state of the memory cell.

10. The sense amplifier of claim 9, wherein the memory cell means comprises:

a first constant current source coupled to the memory cell; and a first voltage to current converter coupled to the first constant current source.

11. The sense amplifier of claim 10, wherein the reference means comprises:

a second constant current source coupled to the first reference high bit;

a second voltage to current converter coupled to the second constant current source;

a third constant current source coupled to the first reference low bit; and a third voltage to current converter coupled to the third constant current source.

12. The sense amplifier of claim 11, further comprising a reference voltage generator having an output coupled to the first, second, and third constant current sources.

13. The sense amplifier of claim 12, wherein the reference voltage generator is further characterized as being coupled to a second reference high bit and a second reference low bit.

14. The sense amplifier of claim 13, wherein the first constant current source comprises a first transistor having a first current electrode coupled to a first power supply terminal, a control electrode coupled to the reference voltage generator, and a second current electrode coupled to the memory cell, the first voltage to current converter, and the doubler means.

15. The sense amplifier of claim 14, wherein the second constant current source comprises a second transistor having a first current electrode coupled to the first power supply terminal, a control electrode coupled to the reference voltage generator, and a second current electrode coupled to the second voltage to current converter.

16. The sense amplifier of claim 15, wherein the third constant current source comprises a third transistor having a first current electrode coupled to the first power supply terminal, a control electrode coupled to the reference voltage generator, and a second current electrode coupled to the third voltage to current converter.

17. The sense amplifier of claim 16, wherein the second voltage to current converter comprises:

a fourth transistor having a first current electrode coupled to the first power supply terminal, a control electrode coupled to the second constant current source, and a second current electrode coupled to the summing means.

18. The sense amplifier of claim 17, wherein the third voltage to current converter comprises:

a fifth transistor having a first current electrode coupled to the first power supply terminal, a control electrode coupled to the third constant current source, and a second current electrode coupled to the summing means.

19. A method for sensing a state of a memory cell, comprising:

providing substantially equal currents through the memory cell, a first reference high bit, and a first reference low bit;

generating a memory cell output voltage, a reference high output voltage, and a reference low output voltage from the substantially equal currents;

generating a first memory cell current and a second memory cell current based on the memory cell output voltage;

generating a reference high current based on the reference high output voltage;

generating a reference low current based on the reference low output voltage;

summing the first memory cell current and the second memory cell current to form a summed memory cell current;

summing the reference low current and the reference high current to form a summed reference current; and comparing the summed reference current to the summed memory cell current to sense the state of the memory cell.

20. The method of claim 19, further comprising:

generating a reference voltage based on a second reference high bit and a second reference low bit; and wherein the step of generating substantially equal currents uses the reference voltage.

* * * * *